United States Patent

[11] 3,590,343

[72] Inventors Harvey C. Nathanson
Pittsburgh;
John R. Davis, Jr., Export; Terence R. Kiggins, Latrobe, all of, Pa.

[21] Appl. No. 795,671
[22] Filed Jan. 31, 1969
[45] Patented June 29, 1971
[73] Assignee Westinghouse Electric Corporation
Pittsburgh, Pa.

[54] RESONANT GATE TRANSISTOR WITH FIXED POSITION ELECTRICALLY FLOATING GATE ELECTRODE IN ADDITION TO RESONANT MEMBER
6 Claims, 4 Drawing Figs.

[52] U.S. Cl. .......... 317/235R,
317/235 B; 317/235 G; 317/235 M
[51] Int. Cl. .......... H01l 11/14
[50] Field of Search .......... 317/235, 235 R

[56] References Cited

UNITED STATES PATENTS

| | | | |
|---|---|---|---|
| 3,320,499 | 5/1967 | Frank et al. .......... | 317/235 |
| 3,287,506 | 11/1966 | Hahnlein .......... | 179/110 |
| 3,278,853 | 10/1966 | Lin .......... | 330/24 |
| 3,414,782 | 12/1968 | Lin et al. .......... | 317/235 |
| 3,404,450 | 10/1968 | Karcher .......... | 29/577 |

*Primary Examiner*—John W. Huckert
*Assistant Examiner*—Martin H. Edlow
*Attorneys*—F. Shapoe, C. L. Menzemer and Gordon H. Telfer

ABSTRACT: A resonant gate transistor is provided with a gate electrode with means to bias the gate so that normally off detectors such as P-channel MOSFETs can be employed, such detectors being more compatible with NPN bipolar transistors for integration than normally on N-channel detectors. The gate electrode is preferably biased by a floating diode of very small capacitance so as to avoid charge leakage and reduced gain. The gate electrode permits large area electrostatic coupling with the vibratory member.

WITNESSES:

Leon M. Garman

Bernard R. Giegue

INVENTORS
Harvey C. Nathanson, John R. Davis, Jr.
and Terence R. Kiggins.
BY
Gordon H. Telfer
ATTORNEY

RESONANT GATE TRANSISTOR WITH FIXED POSITION ELECTRICALLY FLOATING GATE ELECTRODE IN ADDITION TO RESONANT MEMBER

ACKNOWLEDGEMENT OF GOVERNMENT CONTRACT

The invention herein described was made in the course of and under a contract with the Department of the Air Force.

BACKGROUND OF THE INVENTION

1. Field of the Invention

This invention is directed to microelectronic devices and integrated circuits that include a tuning element, particularly a resonant gate transistor.

2. Description of the Prior Art

Nathanson and Wickstrom U.S. Pat. No. 3,413,573, Nov. 26, 1968, is directed to a device wherein a vibratory member, such as a cantilever, is used to control a field responsive element, such as a surface potential controlled transistor, to provide a "resonant gate transistor" (RGT). An input signal at a resonant frequency of the vibratory member affects the output of the responsive element in a frequency selective manner. That patent should be referred to for further information with respect to resonant gate transistors as may other publications such as an article by Nathanson et al. in IEEE Transactions on Electron Devices, Volume ED–14, pages 117 to 133, March, 1967.

In embodiments of RGTs particularly described in the prior art, the detector element was like a conventional MOSFET but without the gate electrode. Instead, the vibratory member acted as the gate of the device. Such embodiments have been successful and pose no particular problem where the detector is a normally on element. That is, where the detector is such that it is conductive of current without application of any gate bias. Normally on MOS elements, particularly N-channel elements, can be readily provided. If normally off detector elements are used in the conventional RGT device, operation is very inefficient because the vibrating beam cannot readily induce sufficient charge in the channel region and the gain of the device is vanishingly small.

Normally on detectors require close control of surface charge and substrate resistivity if detector impedance level and device gain are to be at an optimum. This close control is most difficult to attain when integrating an RGT with a bipolar transistor in the same chip by present day technology that essentially dictates that at least some of the bipolar transistors be of NPN polarity. This means that the effective substrate for an RGT with a normally on, N-channel, detector device would be a P-type diffused region in which surface concentration as well as surface charge are very difficult to control. At the present state of technology it is not practical to form a P-channel MOS device that is normally on. This is accounted for by reason of the fact that in oxide layers, and other insulator layers on silicon, trapped charges are of positive polarity.

Prior bias schemes for high input impedance active devices are relevant to this invention, as will be more apparent hereinafter. In particular, reference is made to Lin U.S. Pat. No. 3,278,853, Oct. 11, 1966, that is directed to the combination of a field effect transistor with a diode as the impedance element in its biasing circuit, the diode being biased near the origin of its current-voltage characteristic curve.

SUMMARY OF THE INVENTION

By this invention the problems of the prior art re avoided and other advantages are attained through the provision of an RGT with a fixed position gate electrode that can be used to turn on a normally off detector element. The detector element may be a P-channel device whose fabrication is thoroughly compatible with that of NPN bipolar transistors by present day commercial integrated circuit technology.

The gate electrode which is provided in addition to the vibratory member is biased by a diode floating at or near the origin of its current-voltage characteristic curve. The biasing diode necessarily must have low capacitance, compared with the capacitance of the active gate portion of the detector. The leakage current of the bias diode must be sufficiently low such that the time constant of diode leakage in parallel with the gate capacitance is much greater than the operating frequency of the RGT. These requirements mean that for normal silicon-silicon dioxide processing the junction area of the diode must be less than about one-tenth of the area of the active gate which approximates the width times the length of the detector channel.

In a preferred case, the oxide layer under the gate electrode is within the range of about 1000 angstroms to about 1500 angstroms when the oxide over the remainder of the surface is at least five times greater, preferably about 10,000 angstroms. The gate electrode may extend over the thicker oxide without disadvantage because of its low capacity. This permits a wide area vibratory member to be used with the extended gate to achieve massive pumping power by providing ample charge in the channel of the detector element.

As compared with conventional RGTs, this invention provides a continuously controllable detector output impedance. Surface charge is no longer critical, does not have to be purposely accentuated and can be reduced to a low level in a known manner by annealing with attendant noise reduction in the detector. Use of a normally off P-channel device eliminates the effect of the otherwise present N-inversion layer that would cause channeling and signal feedthrough. Substrate resistivity is no longer critical and high resistivity epitaxial layers may be used since pinch-off is by gate control not by substrate control. Increased geometry flexibility is provided since the MOS transistor detector is not constrained topologically to be under the RGT beam.

DESCRIPTION OF THE PREFERRED EMBODIMENTS

Embodiments of the invention will be particularly described, by way of example, in connection with the integration of RGTs having MIS FET detector with NPN bipolar transistors by present integrated circuit technology.

Figure 1:
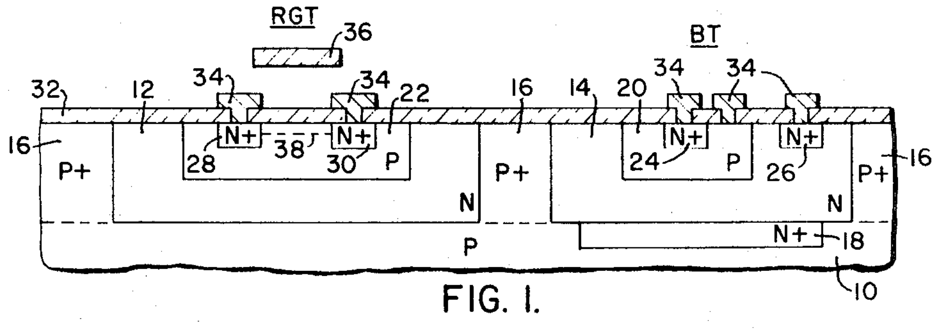
FIG. 1 is a partial cross-sectional view of a semiconductor integrated circuit including a resonant gate transistor whose field responsive element is a normally on FET.

By way of background to the preferred embodiments, FIG. 1 shows an integrated structure including an RGT with a bipolar transistor designated BT. The structure includes a P-type substrate 10 on which an N-type epitaxial layer has been formed. Isolated portions 12 and 14 of the epitaxial layer are provided by diffused P+ isolation walls 16. In the bipolar transistor portion, a diffused N+ "buried collector" region 18 underlies the epitaxial material of region 14. A diffusion to form a P-type transistor base region 20 is also used to form a region 22 acting as the substrate of the RGT detector element. An additional selective diffusion to form the N+ emitter region 24 of the bipolar transistor, and its collector contact region 26, is also used to form source and drain regions 28 and 30 of the RGT detector element. An insulating layer 32, such as one of silicon dioxide or other insulator possibly including silicon nitride, covers the surface except where ohmic contacts 34 to the semiconductor body are formed as to the emitter, base and collector contacts regions and to the source and drain regions. A vibratory member 36 is provided over the channel region 38 defined between the source and drain regions 28 and 30 of the detector element in the RGT structure.

The structure of FIG. 1 is an essentially straightforward integration of the previously known RGT structure that includes a normally on N-channel MOS detector element. Because the P-type diffusion for substrate region 22 is dictated by the requirements of the transistor base region 20, it is of relatively high surface concentration resulting in difficult fabrication control problems for consistent formation of the RGT detector. Without very close control of the diffusion operations the detector pinch-off current is unpredictable.

To further develop the problems attendant with the structure of FIG. 1, the relationship between the pinch-off current and pinch-off voltage to the surface charge and surface concentration may be considered. It can be shown that for moderate values of surface charge ($Q_{ss}=10^{12}$cm.$^{12}$) and source to drain voltage drop at the onset of inversion ($2\phi_F=0.6$ v.), the surface concentration ($C_0$) must be less than about $10^{17}$ atoms per cubic centimeter. However, since usual P-type base diffusions may have surface concentrations significantly in excess of $10^{17}$ atoms per cubic centimeter, large values of surface charge are in fact required.

Purposely accentuated surface charge implies surface channels which indirectly can result in low bipolar transistor beta, excess $1/f$ noise through the possible introduction of fast surface states, and generally lower values of isolation between electrodes in the RGT itself. It is possible to lower the surface concentration in the structure by relying on the silicon dioxide layer's affinity for boron or by using P-type dopants which are consistent with a lower surface concentration, such as aluminum. However, it is known that the pinch-off current, and therefore the detector impedance levels, depends critically on the proper balance between surface charge and surface concentration, both of which are difficult to predict and control independent of other considerations during diffusion processing. Furthermore, it is desirable that straight forward integrated circuit processing technology be employed. Therefore, at the present state of the fabrication art, the structure of FIG. 1 is not economically attractive.

Figure 2:
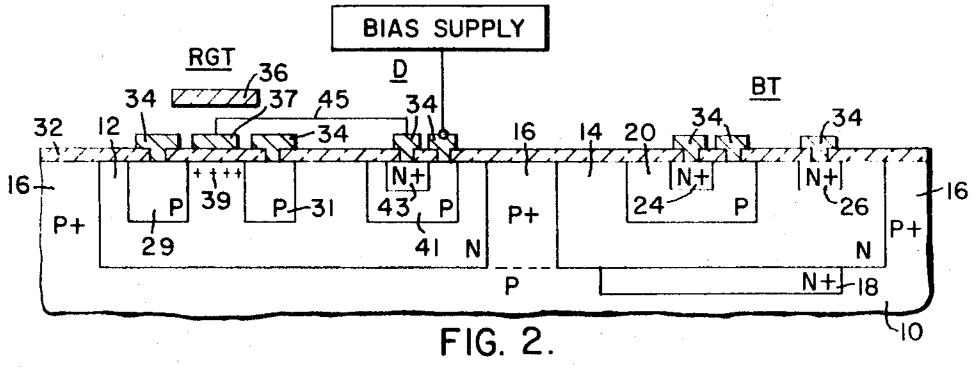
FIG. 2 is a partial cross-sectional view of a semiconductor integrated circuit including a resonant gate transistor in accordance with this invention.

Referring to FIG. 2, a different situation is presented. The same reference numerals are used as for like elements of FIG. 1. Here the bipolar transistor structure BT is the same as in FIG. 1. However, the RGT detector is now a P-channel device employing source and drain regions 29 and 31 formed in the diffusion for the base 20 of the bipolar transistor and, as inherently results with silicon and silicon dioxide processing, the detector element is now one that is normally off.

Since the detector is normally off, the balance problem between surface charge and surface concentration is avoided. But other modifications are required to create the surface current for the detector element which must somehow be induced. Turn on is achieved by having a gate electrode 37, in addition to vibratory member 36. The current in the channel 39 is carried by holes induced by negative charge on the gate 37. Bias voltage is applied to an additional P-type region 41, that may also be formed during the base diffusion. This bias voltage appears on the added gate electrode 37 of the detector through a small area N+P diode D, the N+ region 43 being formed during the emitter diffusion. Each side of the diode D has a contact 34. The N+ region 43 is directly connected to the gate 37 by conductor 45. Since the gate 37 and region 43 are not tied to a fixed potential they will float electrically and assume the potential applied to the P-region 41. This potential is chosen as negative as that polarity is required to turn on the P-channel of the detector element. The diode itself is at essentially zero bias at which it has very high resistance. Reference may be made to Lin U.S. Pat. No. 3,278,853 and an article by Lin et al. in the proceedings of the 1965 International Solid State Circuits Conference, entitled "A Low Noise Integrated Unibi Amplifier with Novel Biasing Scheme and Structure" for further description of the biasing mechanism.

The diode provides DC continuity, but because it is of very high impedance around zero bias, it is essentially an AC open circuit relative to the impedance of the MOS gate capacitance at the beam resonant frequency. As far as the vibrating member of the RGT is concerned then the gate electrode is floating at constant charge and is essentially "transparent" to the effect changes in RGT beam position have on the channel charge. Or stated differently, the floating gate forces the surface of the oxide layer above the channel to be at an AC equipotential, which enhances the AC output impedance of the detector relative to the normal open channel RGT.

Since the floating gate can be biased externally, channel impedance can be easily adjusted. Equally important, the surface charge can now be minimized consistent with recent processing advances involving the use of pure inert gas post annealing steps for the oxide, such as described in an article by Deal et al., *J. Electrochem. Soc.*, 114, pp. 267—274, March, 1967, which should be referred to for further information. Also now suitable for use is <100> oriented silicon material such as described in an article by Gray et al., *Appl. Phys. Letters*, 8, pp. 31—33, 1966. These techniques will result in better gain, lower noise, higher breakdown voltages and higher yield for the associated bipolar circuitry, although they are not required for the practice of the invention.

Figure 3:
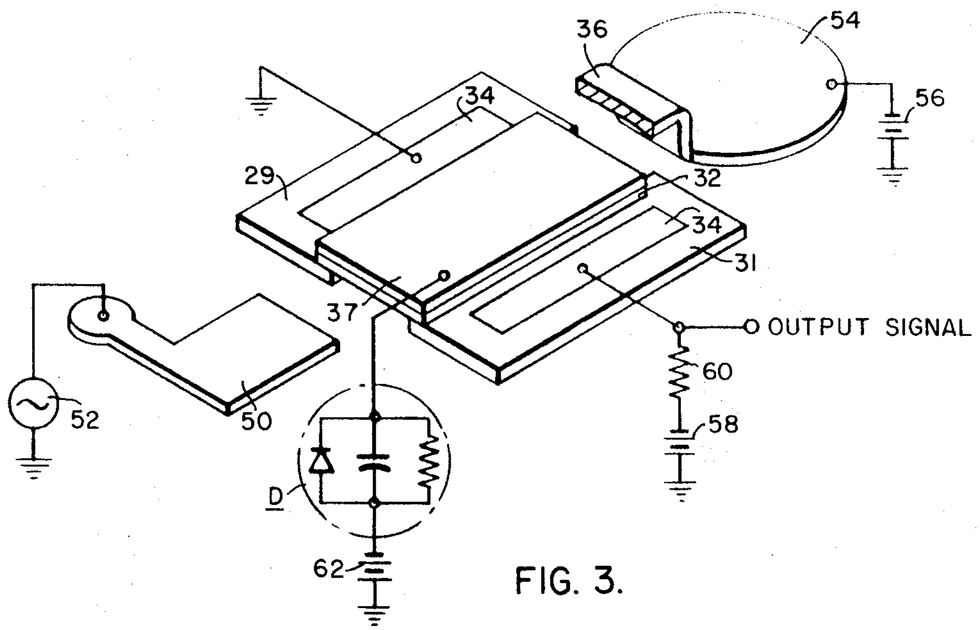
FIG. 3 is a perspective view with schematically shown circuit elements of an embodiment of the invention.

In FIG. 3 is shown a perspective view of the RGT structure with the biasing diode and peripheral circuit elements illustrated schematically. The beam 36 is shown broken away; it extends over the gate as well as over an input field plate 50 to which the input signal is applied from source 52. For simplicity, the insulating layer 32 is shown only under the gate electrode 37. A beam polarizing voltage is applied to the support 54 of beam 36 by DC voltage source 56. The drain 31 of the RGT is supplied by a source of potential 58 through a load 60. The output signal may be taken as shown, from the claim 31. In one manner of use it would be the input signal for a bipolar amplifier stage, preferably one integrated with the RGT. Another DC source 62 supplies the bias potential to the diode D.

It can be shown from theoretical considerations that the gain of the RGT depends critically on the magnitude of the ratio of diode capacitance ($C_o$) to the capacitance of the active gate ($C_G$) of the RGT. As low a diode capacitance as possible is desirable.

$$C_D=\epsilon_{si}A_D/W_{dep.}$$

where $\epsilon_{si}$ is the dielectric constant of silicon (the relative dielectric constant of silicon is about 12) $A_D$ is the diode junction area, and $W_{dep.}$ is the width of the depletion layer at the diode junction at zero bias.

$$C_{ox}=\epsilon_{ox}AA\gamma GW_{ox}$$

where $\epsilon_{ox}$ is the oxide dielectric constant (the relative dielectric constant of silicon dioxide is about 3.8), $A_G$ is the active gate area (approximately equal to the width times length of the channel region), and $W_{ox}$ is the thickness of the oxide layer under the gate. In general, these considerations require $A_D$ be less than about 1/10 times $A_G$.

Figure 4:
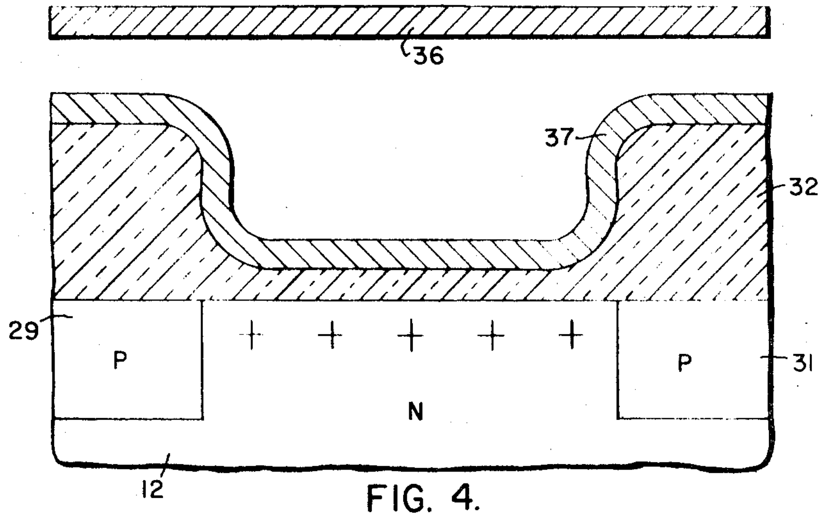
FIG. 4 is a partial sectional view of an alternative embodiment.

Additionally, other parasitic capacitances, due to gate to drain overlap for example must be minimized. This may be done by limiting the gate electrode only to the position over the channel (essentially as in FIGS. 2 and 3) or by having much reduced capacitance outside the channel area. The latter can be readily achieved by making the insulator layer much thicker (at least five times) over the surrounding surface then over the channel. For silicon dioxide thicknesses of 1000—1500 angstroms over the channel and 10,000 angstroms elsewhere are suitable. FIG. 4 illustrates such a case which offers advantages for large area coupling with the beam 36.

RGTs in accordance with this invention have been successfully made on N-type silicon having a resistivity in the range of 11.25 to 18 ohm-cm. Boron diffusion for source, drain and diode anode regions was to a surface concentration of $1.5\times10^{19}$ a./cm.$^3$, an initial junction depth of 2.4 microns (final about 4.5 microns) and a sheet resistivity of 78 ohms per square. Phosphorous diffusion for the diode cathode region was to a junction depth of 3.0 microns and a sheet resistivity of 3.3 ohms per square. These parameters are consistent with those for bipolar transistors. The resonant beam was fabricated in accordance with known practice for operation at 5 kHz.

The use of a fixed gate electrode in addition to a vibratory member is described particularly in connection with its use on normally off MIS transistor elements, but if the detector element happens to be normally on, the usefulness of the invention is not impaired.

Other field responsive elements as described in the referred to U.S. Pat. No. 3,413,573 may also be employed.

It will be apparent that numerous variations from the specific examples provided may be employed.

We claim:

1. A resonant gate transistor comprising: a substrate, said substrate consisting of a semiconductor material, a vibratory member, said vibratory member having a first portion affixed to but electrically insulated from said substrate and a second portion spaced above said substrate and free to move in relation to said substrate, at least said second portion of said vibratory member comprising electrically conductive material, an electrical input field plate affixed to the surface of said substrate under the second portion of said vibratory member, said field plate serving to establish a varying electric field to cause said vibratory member to vibrate at the frequency of said varying field, an electric field responsive member under said second portion of said vibratory member and a fixed gate electrode positioned between said second portion of said vibratory member and said field responsive member and electrically insulated from said field responsive member.

2. The subject matter of claim 1 wherein: said electric field responsive member is a surface potential controlled transistor having source and drain regions of a first conductivity type within the surface of the substrate region of a second conductivity type and defining a channel region therebetween; an insulating layer is on said channel region and said fixed gate electrode is positioned on said insulating layer.

3. The subject matter of claim 1 wherein: said electric field responsive means is a normally off surface potential controlled transistor.

4. The subject matter of claim 3 wherein: said fixed gate electrode is the same in area as the effective area of said channel region.

5. The subject matter of claim 3 wherein: said fixed gate electrode is larger in area than the effective area of said channel region; said insulating layer is on said channel region as well as on surface portions adjacent said channel region and has a thickness on said adjacent surface portions at least five times that on said channel region.

6. A semiconductor integrated circuit including resonant gate transistor and bipolar transistor elements comprising: a substrate of a first conductivity type; a first region of a second conductivity type on said substrate; source and drain regions of said first conductivity type within a surface of said first region remote from said substrate, and source and drain regions being spaced and defining a channel region therebetween at said surface; an insulating layer on said surface at least over said channel region; a gate electrode positioned on said insulating layer over said channel region; a vibratory member positioned over said gate electrode; a second region of said second conductivity type on said substrate spaced from said first region and serving as a bipolar transistor collector region, a base region of said first conductivity type within a surface of said collector region remote from said substrate; an emitter region second conductivity type within a surface of said base region remote from said collector region.